(12) United States Patent
Buurman et al.

(10) Patent No.: US 7,655,367 B2
(45) Date of Patent: Feb. 2, 2010

(54) LITHOGRAPHIC APPARATUS AND DEVICE MANUFACTURING METHOD

(75) Inventors: Erik Petrus Buurman, Veldhoven (NL); Thomas Josephus Maria Castenmiller, Eindhoven (NL); Johannes Wilhelmus Maria Cornelis Teeuwsen, Helmond (NL); Bearrach Moest, Eindhoven (NL); Marc Antonius Maria Haast, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 274 days.

(21) Appl. No.: 11/384,824

(22) Filed: Mar. 21, 2006

(65) Prior Publication Data

US 2006/0227310 A1   Oct. 12, 2006

Related U.S. Application Data

(63) Continuation-in-part of application No. 11/086,667, filed on Mar. 23, 2005.

(51) Int. Cl.
*G03F 9/00* (2006.01)
*G03C 5/00* (2006.01)

(52) U.S. Cl. .................... 430/22; 430/30; 430/311; 430/322

(58) Field of Classification Search .............. 430/30, 430/311, 322; 372/55, 58, 53, 67, 68, 72, 372/75
See application file for complete search history.

(56) References Cited

U.S. PATENT DOCUMENTS

| 4,883,352 | A | 11/1989 | Bruning | 353/122 |
| 6,535,274 | B2 | 3/2003 | Antoni | |
| 6,690,704 | B2 * | 2/2004 | Fallon et al. | 372/58 |
| 6,795,167 | B2 * | 9/2004 | Ota et al. | 355/67 |
| 6,813,001 | B2 | 11/2004 | Fujisawa et al. | |
| 7,116,695 | B2 * | 10/2006 | Jacques | 372/58 |
| 2001/0008737 | A1 | 7/2001 | Sano | 430/30 |
| 2003/0081192 | A1 | 5/2003 | Nishi | |
| 2004/0179175 | A1 | 9/2004 | Okada | 355/52 |
| 2004/0257547 | A1 | 12/2004 | Koolen et al. | |
| 2005/0002040 | A1 | 1/2005 | Adriaens et al. | |

FOREIGN PATENT DOCUMENTS

| EP | 1 231 515 A1 | 8/2002 |
| JP | 61-181128 A | 8/1986 |
| JP | 9-199403 A | 7/1997 |
| TW | 200426538 | 12/2004 |
| TW | 200426540 | 12/2004 |

OTHER PUBLICATIONS

International Search Report issued for International Patent Application No. PCT/EP2006/002677, dated Sep. 25, 2006.
van de Kerkhof et al., Full Optical Column Characterization of DUV Lithographic Projection Tools, Proceedings of SPIE, vol. 5377, 2004, pp. 1960-1970.
English translation of Korean Official Action issued on May 20, 2009 in Korean Application No. 10-2007-7023807.

* cited by examiner

*Primary Examiner*—Christopher G Young
(74) *Attorney, Agent, or Firm*—Pillsbury Winthrop Shaw Pittman LLP

(57) ABSTRACT

A method and apparatus make use of data representing changes in wavelength of a radiation source to provide control of focal plane position or to provide correction of sensor data. In the first aspect, the wavelength variation data is provided to control systems that control focus by moving apparatus components including, for example, the mask table, the substrate table or optical elements of the projection optical system. In the second aspect, variation data is used in correcting, e.g., focal plane position data measured by an inboard sensor, such as a transmitted image sensor. The two aspects may be combined in a single apparatus or may be used separately.

14 Claims, 2 Drawing Sheets

LITHOGRAPHIC APPARATUS AND DEVICE MANUFACTURING METHOD

This application is a continuation in part of U.S. patent application Ser. No. 11/086,667 filed Mar. 23, 2005, hereby incorporated by reference.

BACKGROUND OF THE INVENTION

1. Field of the Invention

The present invention relates generally to a lithographic apparatus and a method for manufacturing a device.

2. Background of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY OF THE INVENTION

According to an aspect of the invention, there is provided a method of imaging a pattern onto a substrate using a lithographic apparatus including patterning a radiation beam, measuring a wavelength variation of the radiation beam, projecting the patterned beam onto the substrate, and adjusting a focal plane of the projecting based on the measured wavelength variation.

According to another aspect of the invention, there is provided a method of correcting a projected image measurement within a lithographic apparatus including projecting a patterned radiation beam using a projection optical system, measuring a wavelength variation of the radiation beam, measuring image information of the patterned beam, and correcting the measured image information based on the measured wavelength variation.

According to another aspect of the invention, there is provided a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, a sensor, constructed and arranged to measure a wavelength variation of the radiation beam, and a controller, configured and arranged to adjust a focal plane of the lithographic projection apparatus based at least in part on wavelength variation measurements of the sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1:
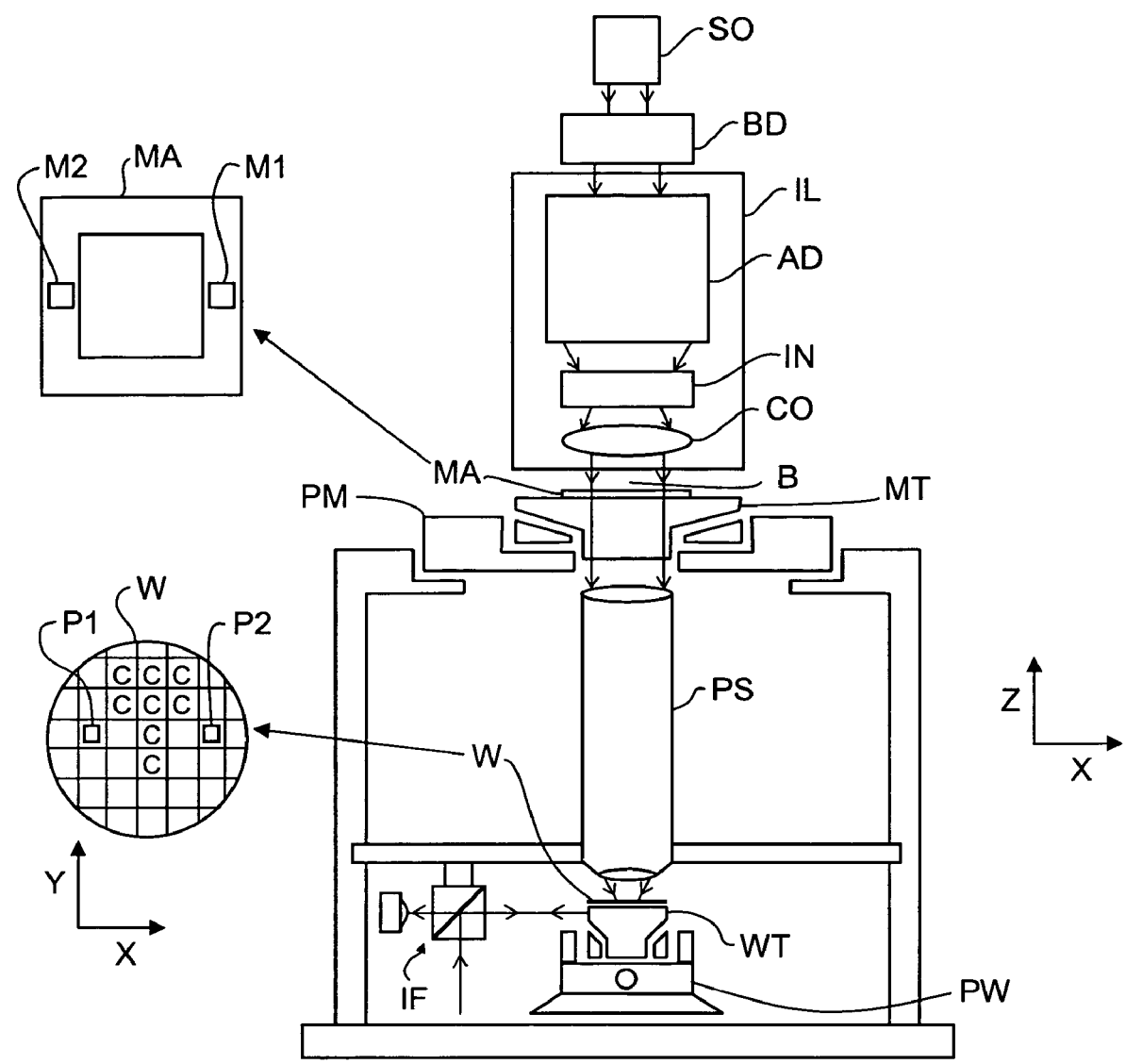
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g., UV radiation or DUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable beam directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

While in principle lasers produce a narrow bandwidth, constant wavelength pulse of radiation, in practice, there is a minor variation in wavelength from pulse to pulse. By variation in wavelength is meant both variation in the peak wavelength within a given wavelength range (i.e., a change in the shape of the spectrum) and a wavelength shift of the entire spectrum (i.e., a change in the position of the spectrum).

Either type of drift tends to result in a change in the centerline wavelength of the spectrum. Lasers designed for lithographic systems include control loops that allow the laser output to have centerline drifts on the order of a fraction of a picometer or even less. For a laser producing light at 193 nm, for example, this represents a drift of a few parts in 1,000,000. Nonetheless, because lithographic projection lenses are designed to be corrected for a specific wavelength, and retain some degree of chromaticity, even this small variation can result in slight differences in focus depending on the pulse wavelength variation of the laser light. Thus, it would be useful to correct for wavelength variation between pulses in order to improve imaging focus without requiring a more chromatically robust lens design. Likewise, the present invention can find application in correcting for drift in a system using a continuous wave source.

At a typical pulse frequency of 1000-6000 Hz, it follows that pulse to pulse wavelength changes occur on the sub-millisecond time scale. In general, projection lenses are not designed to be re-focused on a pulse by pulse basis and, in particular, the response time of focus control is generally insufficient to modify focus at kilohertz frequencies. On the other hand, a phenomenon known as wavelength chirp appears to occur in a time frame on the order of a few milliseconds (e.g., 3-25 ms). At a typical pulse rate of 1000-6000 Hz, this translates to between three and 150 pulses of the laser. Thus, the response time of focus control mechanisms may be short enough to allow correction over the periodicity of the chirp phenomenon. As set forth below, in various configurations of this invention, multiple features of a lithographic apparatus can be adjusted singly or in concert based on a measured change in wavelength of the laser light. For example, an apparatus feature can be adjusted based on an appropriate time scale for adjustment of that feature.

Figure 2:
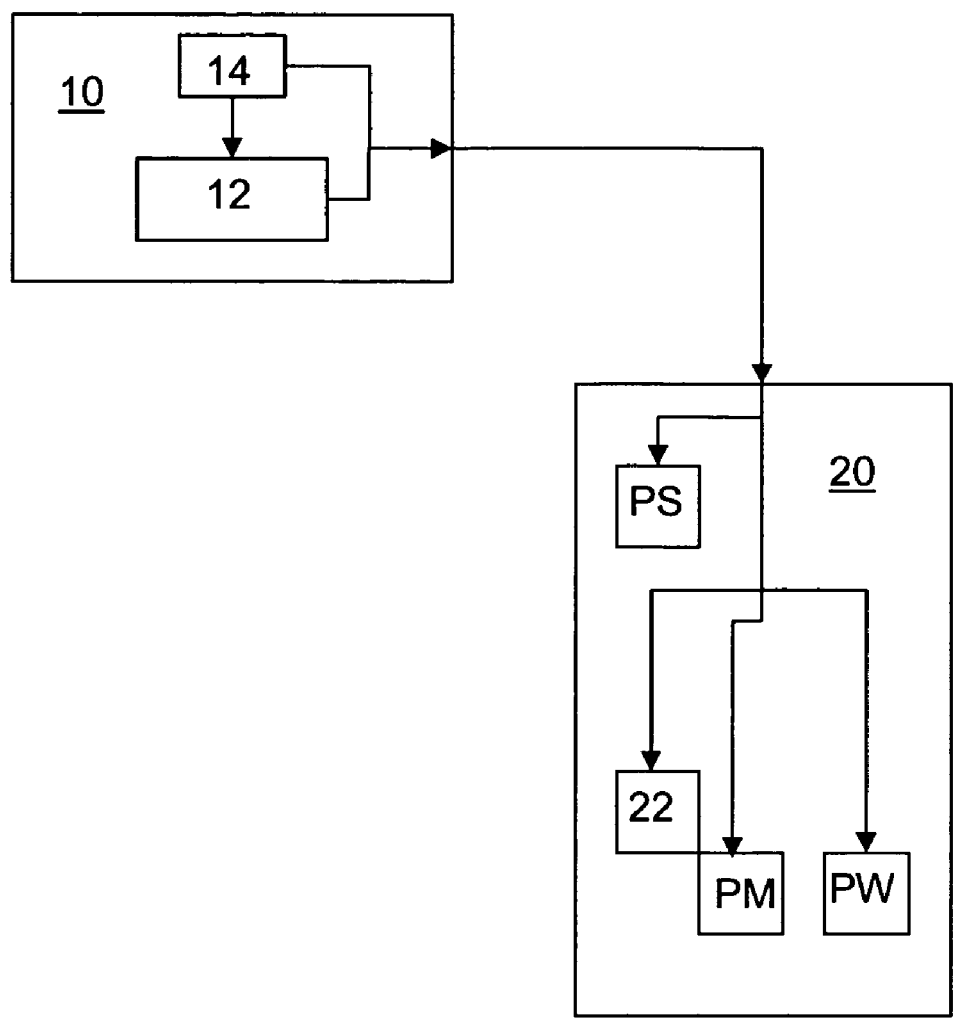
FIG. 2 is a schematic diagram of a system in accordance with an embodiment of the present invention.

Referring now to FIG. 2, a control loop in accordance with the present invention is shown. The light source, e.g., laser 10, includes an internal control loop 12 that is designed to maintain wavelength stability. Because the control loop 12 is designed to control the laser output on a pulse to pulse basis, the laser 10 includes an element 14 for measuring pulse to pulse wavelength variation. As shown in FIG. 2, in accordance with this embodiment, the wavelength measuring element 14 additionally provides that data to the scanner 20. As noted above, the scanner 20 will not, in general, be capable of adjusting focus with sufficient speed. The data received by the scanner 20 is then used in a feedback or feedforward control algorithm for controlling the scanner 20 focus. As should be understood by one of ordinary skill, in the event that the response time of the focus controls of the scanner 20 is short enough to allow for a pulse to pulse wavelength correction, then the present invention can be implemented on a pulse to pulse basis.

The scanner focus can be controlled in a number of ways. For example, the plane of the patterning device or the substrate holder may be adjusted along the optical axis of the scanner using the positioners PM, PW. Alternately, individual lens elements or lens groups forming a part of the projection system PS may be actuated, for example by piezoelectric elements configured for that purpose. In an another alternate embodiment, the substrate table can be locally adjusted relative to the focal plane in order to adapt the focus. Additional focal control mechanisms will be readily apparent to those of ordinary skill in the art and should be understood to within the scope of the present invention. For example, if it is determined that a wavelength change, such as a chirp takes place over a period of about 20 ms, it may be determined that a correction to one or more of the lithographic apparatus features can be applied to compensate for the observed change.

In the case of shifts in the vertical position of a focal plane caused by shifts in the wavelength of laser light, it may be convenient to compensate for the shifts by dyanamically adjusting the lens elements in proportion to the measured shifts. For example, the exposure time used to expose a single die area may be about 100-500 ms and the period of a wavelength chirp may be about 20 ms. Therefore, over the duration of exposure of a single die, the wavelength of laser light may fluctuate many times. Corrections to one or more lens elements of the projection lens can be applied to compensate for this wavelength chirp, for example, by adjusting the focal plane using the lens elements at an interval comparable to the wavelength chirp period, such as adjusting the focal plane every 10 to 20 ms. In this manner, the wavelength fluctuations could be suppressed so that the focal plane remains relatively constant during exposure of the entire die.

On the other hand, it may be convenient to adjust the height of a substrate table in response to a measured change in wavelength. For example, if a slower drift in laser wavelength is observed, it may be convenient to adjust the wafer table height and/or table tilt in response to the drift in focal plane that occurs due to the wavelength drift. In one example, the wafer table height could be adjusted between each die exposure in response to measured wavelength drifts.

An additional effect of pulse to pulse instability arises in the operation of inboard sensor systems that make use of the projection light. Using projected light, the inboard sensor systems may help determine operating properties of the lithographic apparatus such as relative positioning of mask and substrate table, projection lens aberration, and the like. For example, one type of inboard sensor is a transmitted image sensor (TIS) that is incorporated in certain lithography equipment and makes measurements of the image transmitted by the projection system PS. It makes these measurements at or near the plane of the substrate table WT and is thus subject to inaccuracies resulting from focal plane drift due to wavelength variation of the source. The TIS is a measurement instrument that measures a location of an aerial image of an object mark in space and that measures a shape of the aerial image. The object mark may be placed on a reticle or on a reticle stage fiducial. The location information may be used to mathematically couple the reticle to the substrate table. In other words, the location information can be used to measure the position of the mask with respect to the position of the substrate table in six degrees of freedom. The location information may be used to expose images on the substrate that are located at a best-focus (BF) position (z-position) and in a correct lateral (x-y) position (correct overlay). The information regarding the shape of the aerial image may be used for machine set up, calibration and monitoring.

For example, in determining an optimal alignment, or best overlay condition, a horizontal scan in an X-Y plane parallel to a wafer stage can be performed using a TIS. A pattern within a TIS located in the wafer stage can be aligned with a corresponding pattern in the mask stage of the lithographic apparatus. At an optimal alignment position used to determine the best overlay, the intensity registered in a detector in the TIS may reach a maximum during a horizontal scan. This horizontal scan is preferably performed when the patterned portion (grating) of the TIS is located in a plane of best focus (focal plane). The position of a focal plane can, in turn, be determined using a vertical (that is, a direction substantially orthogonal to the wafer plane) scan of the TIS and detecting an intensity maximum in light received. However, the duration of a TIS scan can be on the order of about 0.1-1 second, during which the laser wavelength can vary as described above. Accordingly, without correction a horizontal TIS scan, for example, can encompass a period in which the focal plane fluctuates or drifts, such that the z-position of the TIS grating moves out of the focal plane or fluctuates in and out of the focal plane, thus negatively affecting the ability to determine the correct overlay position using the horizontal scan Thus, in a second embodiment of the present invention, laser pulse wavelength variation data is fed to the scanner 20 and used in correction of TIS information. In this regard, the data may be directly fed to the TIS and/or its respective processor in a feedforward or real-time correction mode. Alternately, it may be fed separately to a processor for post-processing of the TIS data, taking into account the pulse variation data. Preferably, data collected from wavelength measuring element 14 is used to correct alignment procedures in a timely fashion. For example, a TIS can be engaged to perform an alignment measurement after each wafer exposure. Accordingly, a processor associated with the TIS can be configured to receive real-time laser pulse wavelength data at the time the TIS is engaged to perform the alignment measurement. As described below, the variation in wavelength can be used, for example, by the TIS to improve the determination of a best overlay condition, which can be used for exposure of a patterned substrate by projecting a beam through a mask, based on the best overlay of the mask with patterned features of the substrate.

In one embodiment of this invention, while a horizontal scan that is nominally within the focal plane is performed by the TIS, the wavelength variation information can be received by a processor for post-processing of TIS data. The laser pulse wavelength variation data can be collected and stored as a function of time or TIS position during a TIS scan, such that the wavelength variation data is used to correct alignment determination. When the wavelength of the patterned beam of radiation varies between pulses or over a series of pulses, the plane of focus varies accordingly. Thus, during a TIS scan, this pulse to pulse variation in focal plane can be considered to constitute focus error, since the TIS grating ideally travels in a fixed focal plane during a horizontal scan. However, for a scan in an apparatus subject to wavelength changes, since the wavelength variations cause the vertical position of the focal plane to change, the TIS grating is actually located above or below the focal plane during at least portions of the horizontal scan, in accordance with the radiation wavelength shift between pulses or during the series of pulses.

Whether pulse to pulse wavelength changes that cause focus error constitute random wavelength variations or a wavelength chirp, after a TIS scan is complete, the wavelength variation data collected can be used to improve a curve fit determined by the TIS as follows. During a TIS scan, radiation intensity as a function of horizontal position is measured at a series of points (samples). The sample data thus obtained can display a peak in radiation intensity vs. position that corresponds to an aligned condition. Curve fitting can be done to determine the position of a peak in the sample data so that a best overlay position is found. The curve fit results can be improved by using a processor, algorithm, or other means to remove the contribution of focus error caused by the wavelength changes during the scan. Accordingly, a more accurate overlay position can be obtained. This procedure can be employed, for example, to improve reticle alignment that is facilitated by the overlay position determined from the TIS scan.

In another embodiment of the present invention, wavelength variation data collected by a wavelength measuring element, such as element 14, is used to correct operation of and integrated lens interferometer at scanner (ILIAS). An ILIAS is an inboard sensor that includes an interferometric wavefront measurement system that may perform static measurements on lens aberrations up to a high order. It may be implemented as an integrated measurement system used for system initialization and calibration. Alternatively, it may be used for monitoring and recalibration "on-demand". Thus, a wavelength sensor such as element 14 can be coupled to an ILIAS (not shown). The wavelength sensor can measure wavelength changes in light that is projected through a lens when the light is measured by the ILIAS to determine lens properties. The measured wavelength changes can be fed from element 14 to a processor coupled to or associated with the ILIAS during a lens measurement being performed by the ILIAS. The ILIAS can then adjust its determination of the lens aberration based on the wavelength variation that takes place during the lens measurement, thereby increasing the accuracy of lens property measurement.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of imaging a pattern onto a substrate using a lithographic apparatus comprising:
   patterning a radiation beam;
   measuring a wavelength variation of the radiation beam;
   determining a best overlay condition based on the measured wavelength variation; and
   projecting the patterned beam onto the substrate based on the determined best overlay condition,
   wherein measuring the wavelength variation comprises measuring wavelength chirp of the radiation beam.

2. A method as in claim 1, wherein the measuring comprises measuring a centerline drift of a spectrum of the radiation beam.

3. A method as in claim 2, wherein the measuring comprises measuring variation between pairs of consecutive pulses of the radiation beam.

4. A method as in claim 1, wherein the determining a best overlay condition comprises:
   determining a focal plane of the projected patterned beam using a vertical scan of an image sensor; and
   performing a horizontal scan using the image sensor while the image sensor is nominally within the focal plane.

5. A method as in claim 4, wherein the image sensor is a transmitted image sensor (TIS).

6. A method as in claim 4, wherein the determining the focal plane comprises detecting a maximum in light intensity, and wherein a maximum in light intensity detected by the image sensor during the horizontal scan corresponds to an optimal alignment that is used to determine the best overlay condition.

7. A method as in claim 6, wherein determining the best overlay condition further comprises:
   receiving data corresponding to the measured wavelength variation during a scan of the image sensor; and
   applying the data to a curve fitting procedure used to determine a position of the maximum in light intensity.

8. A method as in claim 1, further comprising: adjusting a focal plane of the projected patterned beam at an interval substantially comparable to a period of the wavelength chirp.

9. A method of calibrating a lithographic apparatus comprising:
   measuring lens aberration in the lithographic apparatus using a sensor;
   measuring a wavelength variation of the radiation beam during the measuring of the lens aberration;
   correcting the measured lens aberration using the measured wavelength variation; and
   calibrating the lithographic apparatus based on the corrected lens aberration,
   wherein measuring the wavelength variation comprises measuring wavelength chirp of the radiation beam.

10. A method as in claim 9, wherein the measuring the wavelength variation comprises measuring a centerline drift of a spectrum of the radiation beam.

11. A method as in claim 10, wherein the measuring the wavelength variation comprises measuring variation between pairs of consecutive pulses of the radiation beam.

12. A method as in claim 9, wherein the sensor is an integrated lens interferometer at scanner (ILIAS).

13. A method as in claim 9, further comprising:
   adjusting a focal plane of the radiation beam at an interval substantially comparable to a period of the wavelength chirp.

14. A method of imaging a pattern onto a substrate using a lithographic apparatus comprising:
   patterning a radiation beam;
   measuring a wavelength variation of the radiation beam;
   projecting the patterned beam onto the substrate; and
   dynamically adjusting a focal plane of the projecting based on the measured wavelength variation,
   wherein measuring comprises measuring wavelength chirp of the radiation beam, and wherein the dynamically adjusting the focal plane comprises adjusting the focal plane at an interval comparable to a period of the wavelength chirp.

* * * * *